(12) United States Patent
Johnson et al.

(10) Patent No.: US 6,244,903 B1
(45) Date of Patent: Jun. 12, 2001

(54) PC CARD RUGGED INTERCONNECT

(75) Inventors: William A. Johnson; James O. Melton, Jr.; James Muia, all of Tampa; Fred Rhyne, III, Lutz, all of FL (US)

(73) Assignee: Group Technologies, Tampa, FL (US)

( * ) Notice: Subject to any disclaimer, the term of this patent is extended or adjusted under 35 U.S.C. 154(b) by 0 days.

(21) Appl. No.: 09/633,478

(22) Filed: Aug. 7, 2000

Related U.S. Application Data (63) Continuation-in-part of application No. 09/329,099, filed on Jun. 9, 1999, now Pat. No. 6,099,355.

(51) Int. Cl.$^7$ .................................................. H01R 25/00
(52) U.S. Cl. .................... 439/638; 439/946.2; 439/271
(58) Field of Search ............................... 439/638, 946.2, 439/271; 361/800, 816, 818; 174/35 GC, 35 R (56) References Cited

U.S. PATENT DOCUMENTS

| | | | |
|---|---|---|---|
| 5,391,083 | * 2/1995 | Roebuck et al. ...................... | 439/76 |
| 5,391,094 | * 2/1995 | Kakinoki et al. .................... | 439/638 |
| 5,457,601 | * 10/1995 | Georgopulos et al. .............. | 361/686 |
| 5,567,180 | * 10/1996 | Seo ....................................... | 439/638 |
| 5,575,670 | 11/1996 | Chen et al. .......................... | 439/138 |
| 5,676,567 | * 10/1997 | Gluskoter et al. ................... | 439/638 |
| 5,820,414 | * 10/1998 | Omori ................................. | 439/638 |
| 6,099,355 | * 8/2000 | Johnson et al. ..................... | 439/638 |

* cited by examiner

Primary Examiner—Tulsidas Patel
Assistant Examiner—Hae Moon Hyeon
(74) Attorney, Agent, or Firm—McHale & Slavin (57) ABSTRACT

A ruggedized PCMCIA card (PC card) connection adapter device includes a rigid housing having a PC card interface assembly and a external component interface assembly. Each interface assembly extends through an associated exterior surface of the housing, and the assemblies are linked to allow transfer of input/output signals therebetween. The PC card interface assembly includes a linking member sized and shaped to fittingly engage the PC card socket of a host computer. A gasket member disposed on the linking member provides a seal between the PC card socket and the linking member when the connection adapter is in place. The rigid housing is permanently affixed to the host computer.

6 Claims, 8 Drawing Sheets

PC CARD RUGGED INTERCONNECT

This application is a continuation-in-part of Ser. No. 09/329,099 filed Jun. 9, 1999 now U.S. Pat. No. 6,099355.

FIELD OF THE INVENTION

This invention relates generally to the protection of PCMCIA-style cards (PC cards) and, in particular, to an interconnect device that provides an environmentally-sealed mechanically rugged interface and electrical signal conduit.

BACKGROUND OF THE INVENTION

The continuing evolution of computers has produced an increased demand for add-on accessories such as memory devices, modems, and the like. This need has, in turn, led to the introduction of credit-card sized devices made in accordance with standards developed by Personal Computer Memory Card International Association (PCMCIA). Adoption of this standard has allowed for the near universal adaptation of an interface through which the above-mentioned accessories may be attached.

Unfortunately, although these so-called PC cards may be readily attached, the sockets that physically permit such connections can often be the source of trouble: these sockets may allow water, dirt, or other unwanted contaminants to enter the computer. When a PC card is installed into a PC card socket, the exposed area around the PC card is typically large enough for dust, dirt, moisture, and the like contaminants to enter the computer. As a result, although many PC-card-using computers are portable enough for remote use, their susceptibility to damage from foreign material often dictates that these machines be used only in clean, office-like environments. This is troublesome because some computers, such as portable computers, are often useful in environments that are not especially computer-friendly. Portable computers, including handhelds, are powerful, adaptable tools that have found use in manufacturing facilities, construction job sites, and a wide variety of harsh environments.

Attempts have been made to provide protective devices for use with PC cards. For example, U.S. Pat. No. 5,575,670 discloses a protective sleeve designed to fit around a PC card and the receiving socket. Brushes inside the sleeve clean the inserted end of the PC card and prevent the entry of dust into the computer. Although the '670 device may help reduce unwanted contamination, such a device is not sufficient for many situations. Many PC cards have an exposed input/output port into which linking cables and external components are attached or exchanged after the PC card is installed. Thus, while the '670 device may protect the interface between the computer and an inserted PC card, the '670 device does not protect the PC card input/output port.

What is needed is a PC card interconnect device that protects PC cards while permitting necessary signal transfer connections to be made. The device should protect a computer PC card socket and a PC card inserted therein, while providing a weather-tight connection between the computer, the PC card, and external components connected to the PC card.

SUMMARY OF THE INVENTION

The instant invention is a connection adapter that allows environmentally-sealed mechanically rugged connections with the input/output port of a PC card used with a host computer such as a desktop, portable, handheld or the like computer. The connection adapter has a rigid housing that includes a PC card interface connector and an external component interface assembly. The interface assemblies are operatively linked, and each interface assembly extends through an associated exterior surface of the housing.

The PC card connection adapter may be permanently connected to the host computer or selectively removably secured to a host computer. The card adapter includes a linking member that engages a host computer PC card socket. The removably secured linking member is fitted with a gasket that seals the PC card socket against unwanted entry of water, dirt, and other contaminants. The PC card connection adapter includes a PC card input/output receptacle plug, such as an AMP connector, that engages the input/output port of a PC card installed within the PC card socket engaged by the linking member.

The external component interface assembly includes an element-resistant external component linking plug that permits a weather-tight connection between an external component and the adapter of the present invention. The external component linking plug is connected with the PC card input/output plug, thereby allowing transfer of signals therebetween.

The selectively removable connection adapter may be secured in place by various attachment means. In one embodiment, the attachment means employs hook-and-loop type fastening material. Alternatively, the device may also be locked in place by a securing pin operatively associated with the housing of the computer. Alternatively, a threaded screw or even adhesive may be used as a locking means.

Alternately, the connection adapter may be permanently secured to the host computer by integrally molding the adapter and computer housing together. The molding includes chemically treating the corresponding surfaces of the preformed computer and adapter resulting in autogenous bonding. By permanently attaching the adapter to the computer some of the internal parts required for the removable assembly may be omitted which reduces the cost and simplifies the construction.

A score line or line of weakness may be included in the integrally molded computer and adapter encircling the adapter to permit disassembly without destroying the computer. A substantial blow to the score line would separate the components.

Upon installation, the present invention allows connection of external components to an installed PC card. In this situation, the device protects the installed PC card from contamination in harsh environments, while providing unimpeded operation of components attached to the PC card input/output port.

Thus, an objective of the present invention is to provide a ruggedized PC card interconnection device that protects an installed PC card and associated PC card socket from contamination in harsh environments, while allowing unimpeded connections of external components to the protected card.

An additional objective of the present invention is to provide a ruggedized PC card interconnection device that may be selectively locked in place with respect to a host computer.

A further objective of the present invention is to provide a ruggedized PC card interconnection device that may allow removal of external components without subjecting a protected host computer to exposure from the elements.

Still another objective of the present invention is to provide a ruggedized PC card interconnection device that may be installed and removed without the need for special tools.

An additional objective of the present invention is to provide a ruggedized PC card interconnection device that protects a host computer PC card socket and a PC card inserted therein, while providing a weather-tight connection between the computer, the PC card, and external components connected to the PC card.

Other objectives and advantages of this invention will become apparent from the following description taken in conjunction with the accompanying drawings wherein are set forth, by way of illustration and example, certain embodiments of this invention. The drawings constitute a part of this specification and include exemplary embodiments of the present invention and illustrate various objectives and features thereof.

DETAILED DESCRIPTION OF THE INVENTION

Although the invention will be described in terms of a specific embodiment, it will be readily apparent to those skilled in this art that various modifications, rearrangements and substitutions can be made without departing from the spirit of the invention. The scope of the invention is defined by the claims appended hereto.

Figure 1:
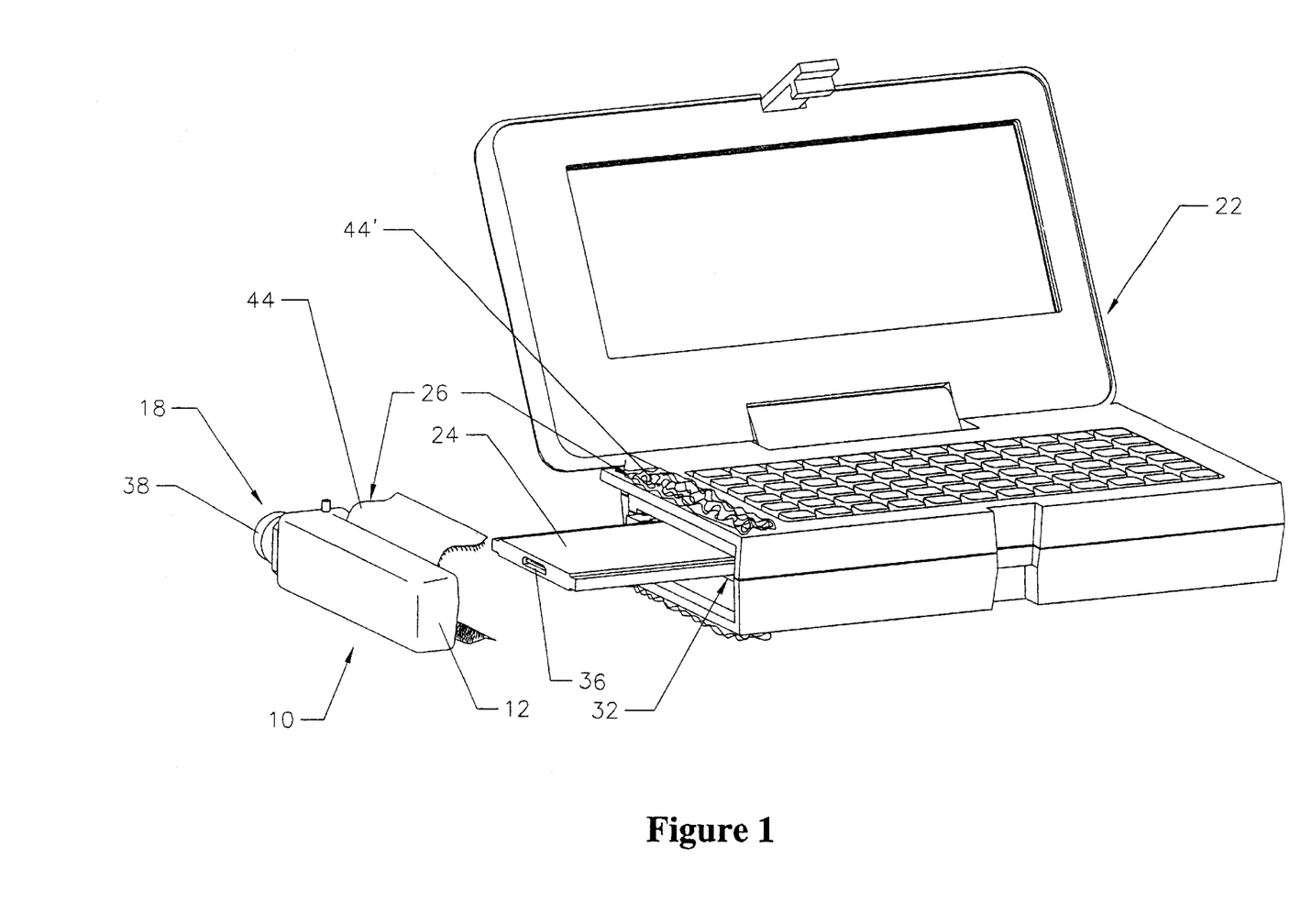
FIG. 1 is an isometric view of the rugged PC card interconnect device of the present invention, shown in use with a host computer.
Figure 2:
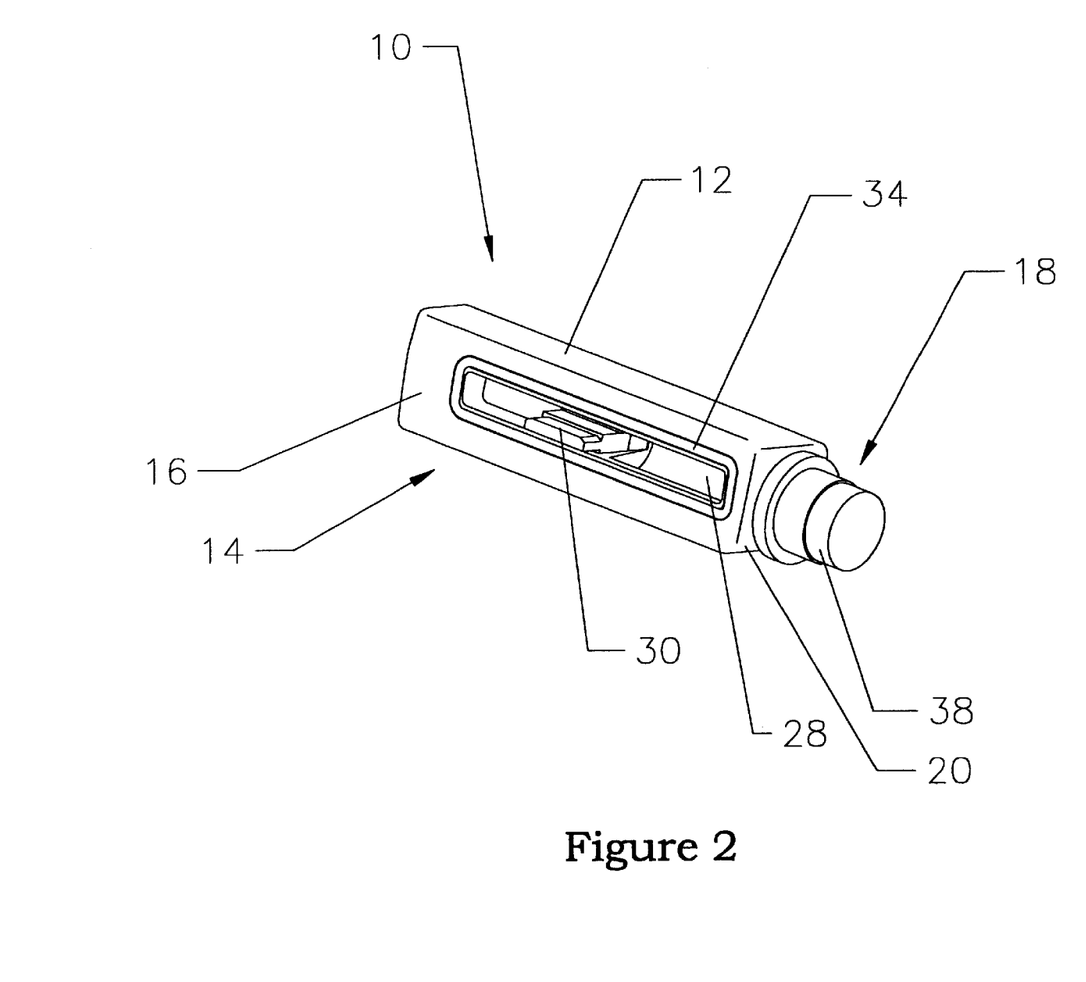
FIG. 2 is an isometric view of the rugged PC card interconnect device of the present invention, showing the included interface assemblies.

Now with reference to FIGS. 1 and 2, the ruggedized PC card interconnect device 10 of the present invention is shown. By way of overview, the interconnect device 10 includes a rigid housing 12 having a card interface assembly 14 and a external component interface assembly 18. The card interface assembly 14 extends through a first exterior surface 16 of the housing 12, and the external component interface assembly 18 extends through a second exterior surface 20 thereof. The housing 12 is adapted for selective attachment to a host computer 22 and a PCMCIA (PC card) 24 inserted within a PC card 32 socket disposed therein. The device 10 also includes a locking means 26 for securing the housing 12 in place. The details of the device 10 will now be discussed.

With continued reference to FIGS. 1–2, the rugged PC card interconnect device housing 12 is preferably a rectangular unit characterized by a PC card interface assembly 14 and a external component interface assembly 18, each extending through respective exterior surfaces 16, 20 thereof. The card interface assembly 14 includes an oblong linking member 28 and a PC card input/output plug 30. In a preferred embodiment, the linking member 28 is a thin-walled, substantially-rectangular ring that extends orthogonally from the rigid housing 12. The linking member 28 is sized and shaped to fit within a PC card mounting socket 32 disposed within a host computer 22. The linking member 28 is preferably bounded by a sealing gasket 34 which ensures a snug, weather-tight fit between the linking member 28 and the PC card mounting socket 32. The PC card input/output plug 30 is shaped to engage the input/output port receptacle 36 of a PC card 24. In a preferred embodiment, the PC card input/output plug 30 is an AMP 15-pin connector. However, other configurations are possible; the PC card input/output plug 30 and linking member 28 configurations are determined by the PC card 24 and socket 32 with which the device 10 will interface.

Figure 6:
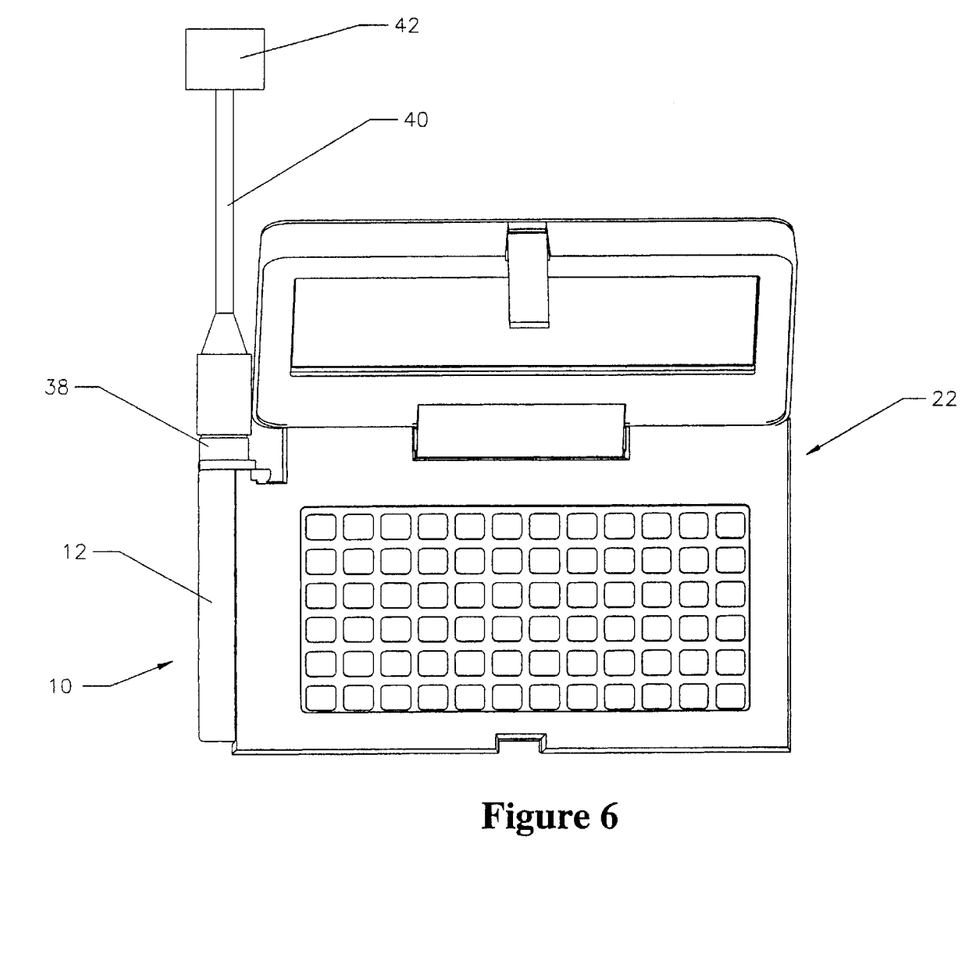
FIG. 6 is a pictorial view of the interconnect device shown in FIG. 1, shown secured to a host computer and connected to an external component.

With respect to FIGS. 2 and 6, the external component interface assembly 18 preferably includes an element-resistant plug 38 that permits a weather-tight mechanically rugged connection between a linking cable 40 and the present invention 10. In a preferred embodiment, the plug 38 is shaped to engage a cable end having a multi-pin receptacle interface. It is noted that other plug 38 interfaces could be adopted, with the configuration being determined by the linking cable 40 which will be connected to the plug and external component 42. In keeping with the objectives of the present invention, the external component interface assembly 18 may be selectively capped to keep dust, dirt, and other contaminants from collecting on the plug 38 itself. The element-resistant plug 38 is wired to the PC card input/output plug 30, to facilitate appropriate signal transfer therebetween.

Figure 3:
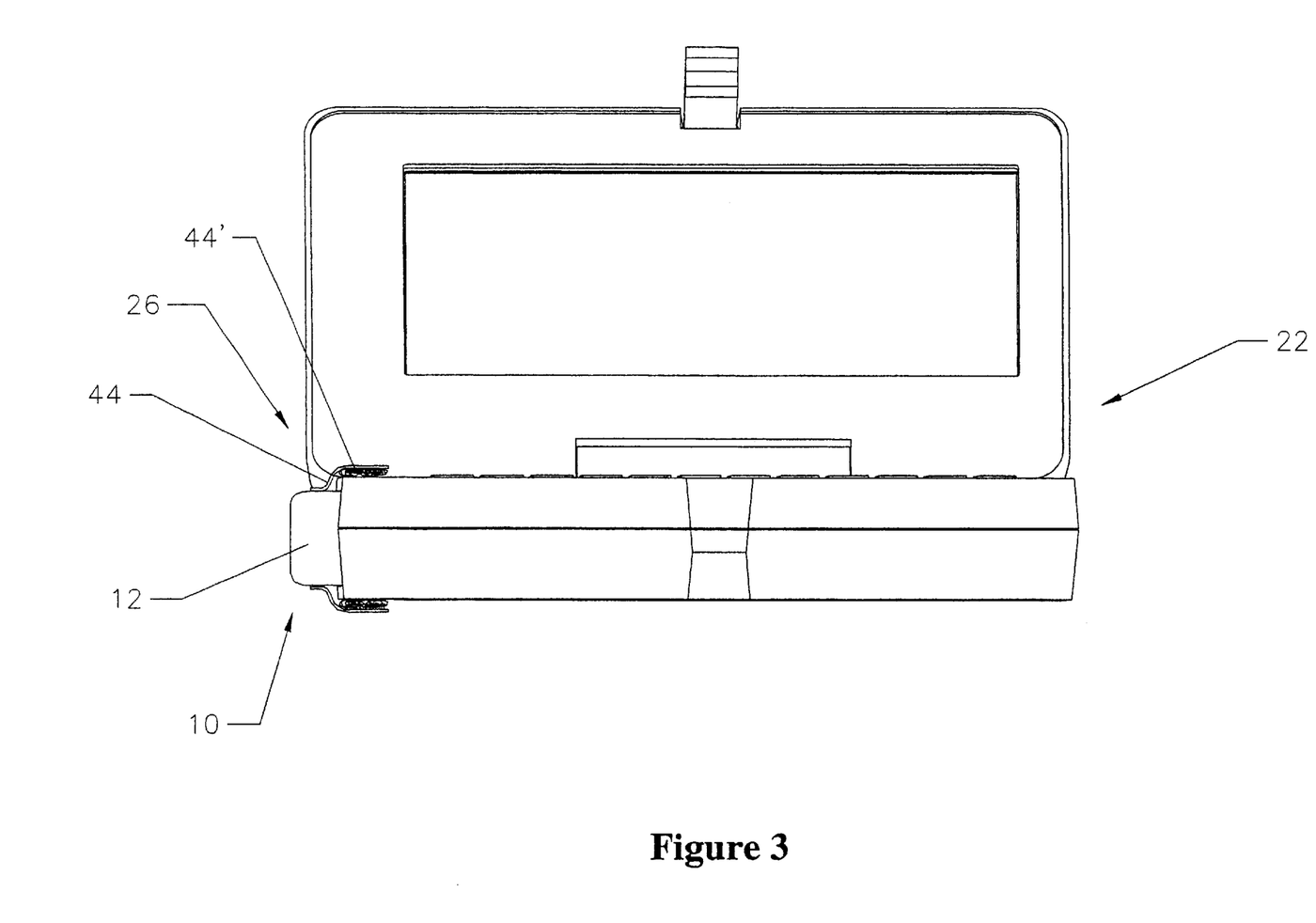
FIG. 3 is a side elevation view of the interconnect device shown in FIG. 1, with a hook-and-loop type material securing arrangement.
Figure 4:
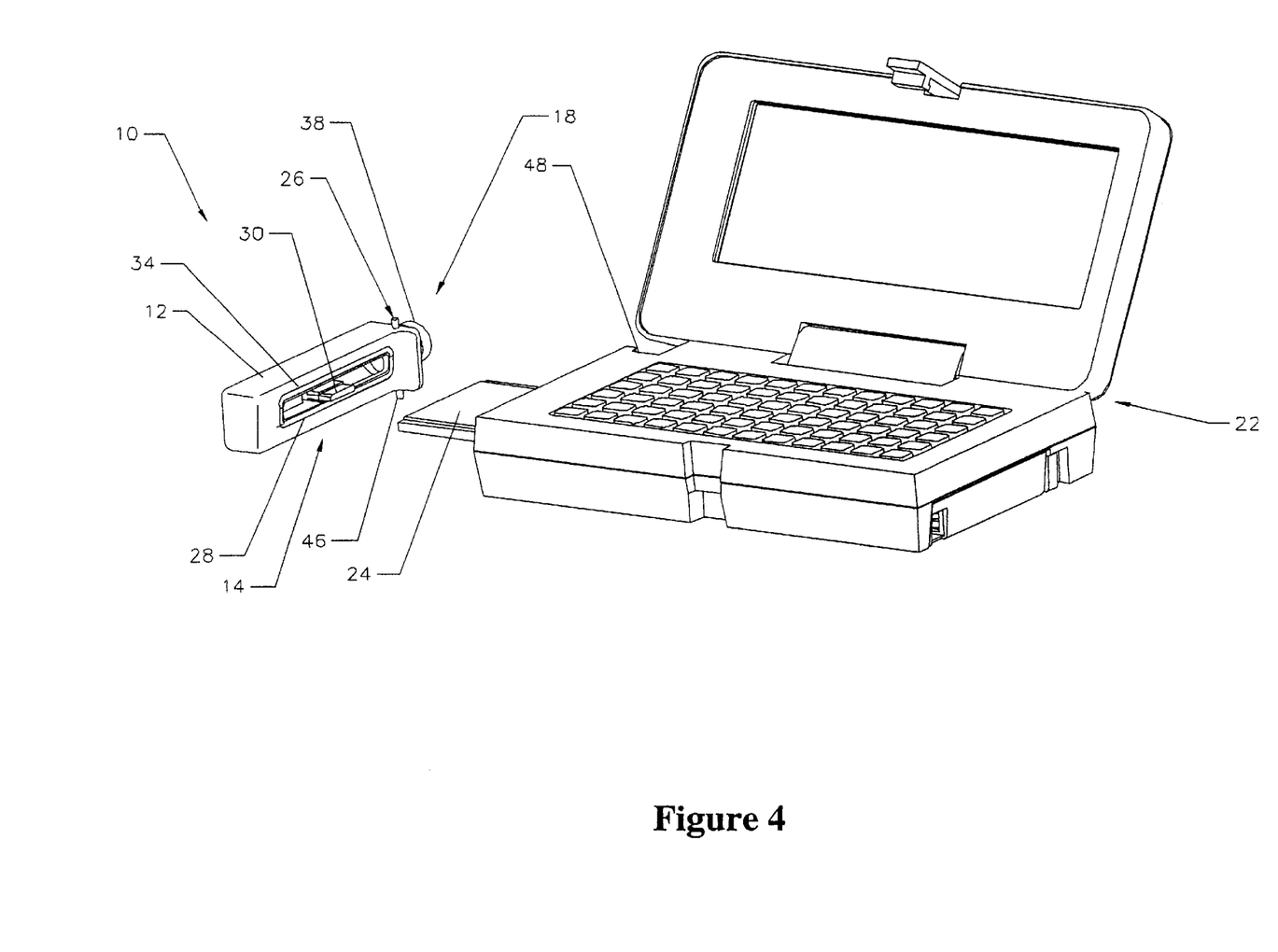
FIG. 4 is an isometric view of the interconnect device shown in FIG. 1, with a locking pin securing arrangement.
Figure 5:
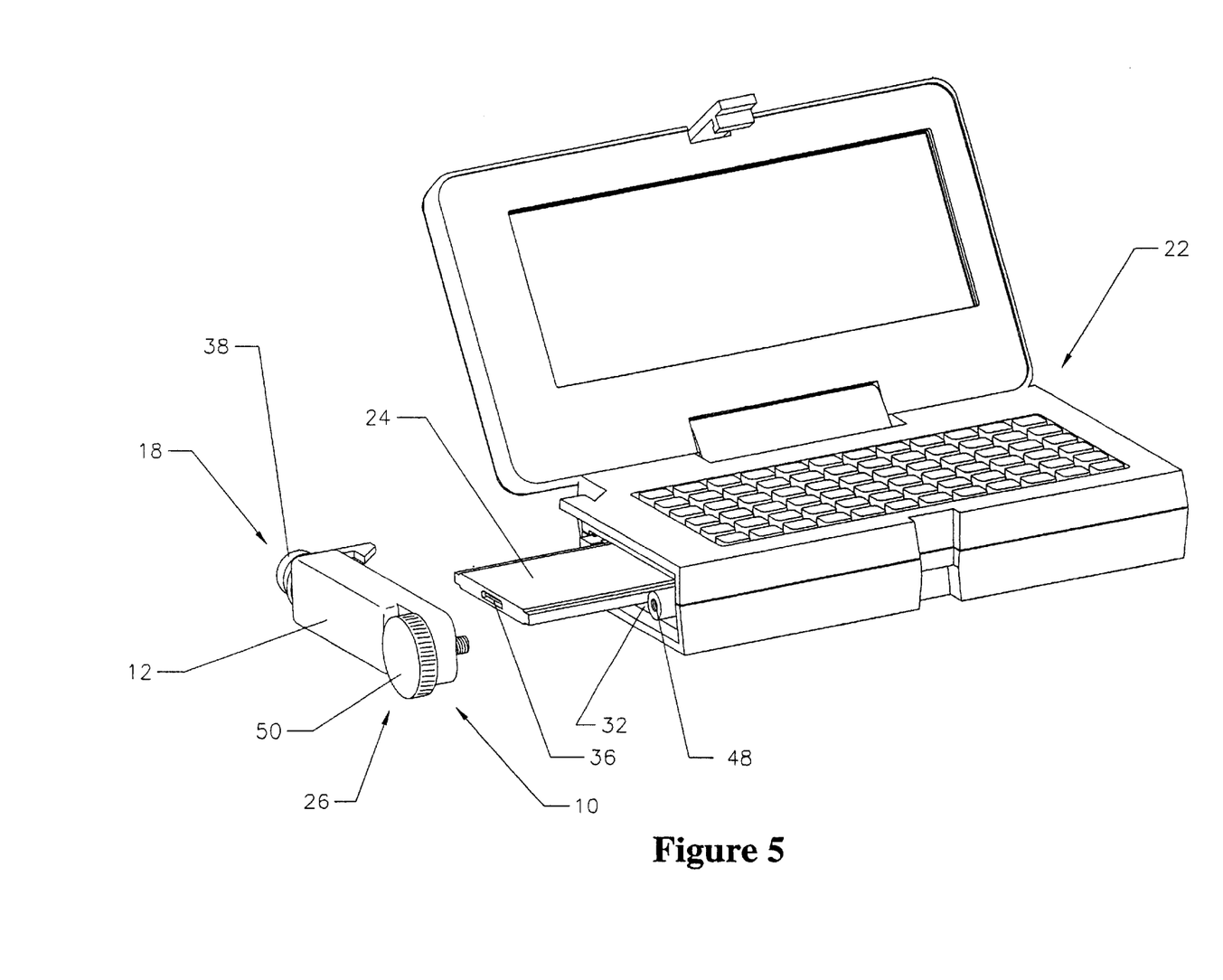
FIG. 5 is an isometric view of the interconnect device shown in FIG. 1, with a threaded screw securing arrangement.

In use, the rugged PC card interconnect device 10 of the present invention is secured against a host computer 22, with the PC card input/output plug 30 engaging the input/output port receptacle 36 of an installed PC card 24. As stated above, the card interface assembly 14 and sealing gasket 34 are shaped to snugly engage a host computer PC card mounting socket 32; however, the included locking means 26 may be used to further secure the device 10. In a preferred embodiment, shown in FIG. 3, the locking means 26 includes corresponding portions 44,44' of hook and loop fastening material disposed on mating surfaces of the rigid housing 12 and host computer 22. One suitable type of hook and loop fastening material is available under the trademark VELCRO. In an alternate embodiment, shown in FIG. 4, the device 10 may also be held in place by a locking pin 46 passing simultaneously through the device housing 12 and into a retention aperture 48 disposed within the host computer 22. The device 10 may, as shown in FIG. 5, also be secured in place via a threaded screw-type fastener 50 extending through the device housing 12 and into the host computer 22. Other securing arrangements may also suffice, with the computer case dictating the most appropriate arrangement. It is not necessary that the locking means 26 provide an element-tight seal between the device 10 and the computer 22; the linking member 28 and sealing gasket 34 cooperate to provide the seal necessary.

Figure 7:
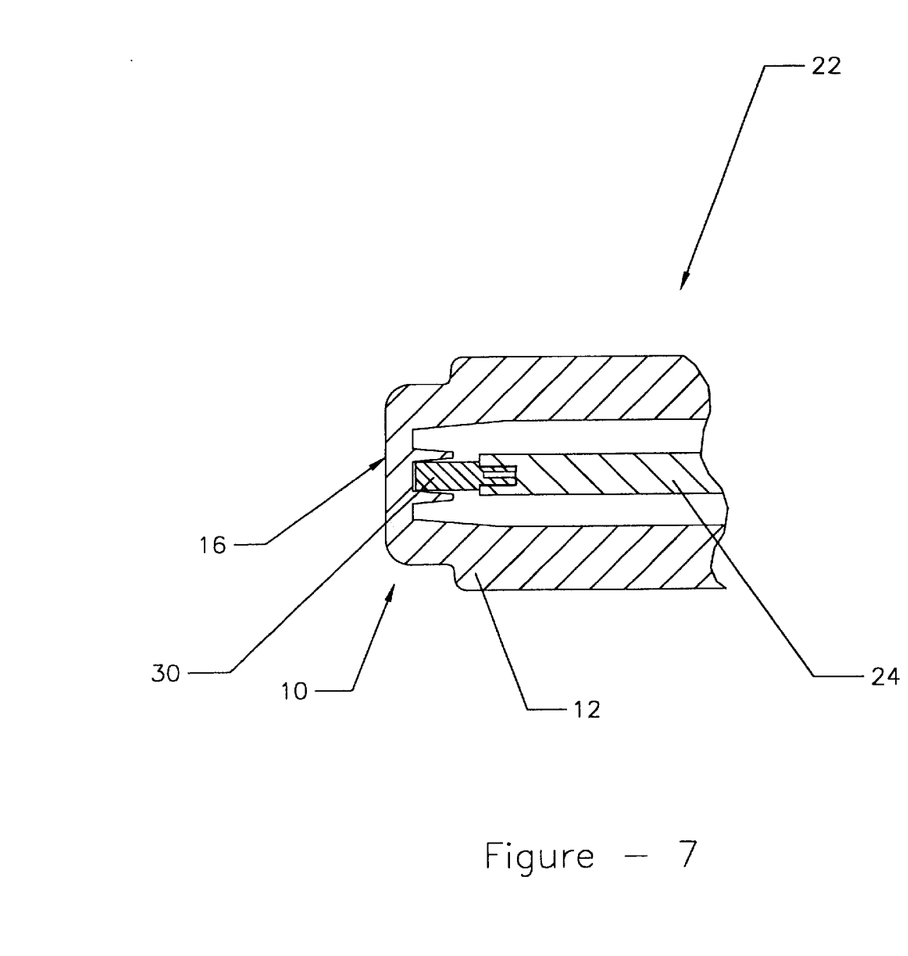
FIG. 7 is a cross section through the computer and adapter of FIG. 3 illustrating the molded connection.

FIG. 7 illustrates an embodiment of the invention wherein the PC card adapter 10 and host computer 22 are permanently secured together. In this embodiment, the adapter 10 includes a rigid housing 12 having a first exterior surface 16 which is permanently secured to the host computer 22 by integrally molding the adapter 10 and computer 22 together.

The molding may include chemically treating the corresponding surfaces of the computer and adapter resulting in autogenous bonding. The PC card 24 is then permanently secured to the input/output port 36 wherein external connection is made by the element-resistant plug, not shown.

The housing 12 may be permanently bonded to the host computer 22 using various adhesives, such as epoxy, selected for appropriate bonding characteristics of the materials of the computer 22 and housing 12. The adhesives may be used individually or they may be used in conjunction with a carrier material.

Figure 8:
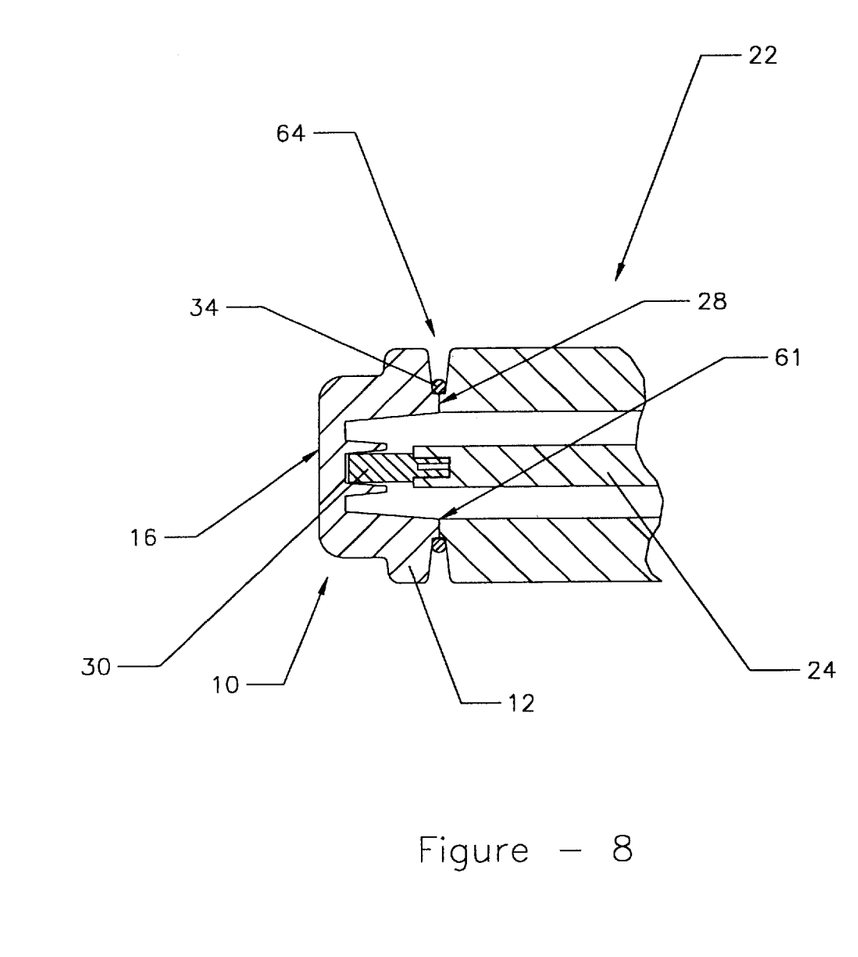
FIG. 8 is a cross section through the computer and adapter illustrating the molded connection, score line and simplified construction.

FIG. 8 discloses an embodiment wherein a score line 61 is included in the structure. In this embodiment, the permanently connected PC card adapter 10 and host computer 22 includes an exterior surface 16 which is permanently secured to the host computer 22 by integrally molding the adapter 10 and computer 22 together. The molding may include chemically treating the corresponding surface of the preformed computer and adapter again resulting in autogenous bonding. The PC card 24 is then permanently secured to the input/output port 36 wherein external connection is made by the element-resistant plug, not shown. The incorporation of a score line 61 allows disassembly without possible damage to the host computer 22. The score line 61 may include a sealing gasket 34 and/or a linking member 28 which can be used to support the gasket by extension orthogonally from the computer 22. Thus, the first exterior surface 16 may include an opening with a score line circumference 64 having a linking member 28 and sealing gasket 34. In the event it becomes necessary to access and/or change a PC card, a clean break may be formed along the score line 61 as a result of a sharp blow. The presence or absence of a score line is determined by the materials used in the housing, the thickness of the housing wall and the particular molding procedures used to form the integrated components.

It is to be understood that while a certain form of the invention is illustrated, it is not to be limited to the specific form or arrangement of parts and/or PC Card herein described and shown. It will be apparent to those skilled in the art that the invention could alternatively be applied to non-rugged plugable cards that require rugged interconnections. It will also be apparent to those skilled in the art that various changes may be made without departing from the scope of the invention and the invention is not to be considered limited to what is shown and described in the specification and drawings.

What is claimed is:

1. A computer interconnect device comprising:

a rigid housing having a first exterior surface;

said rigid housing having a first and second interface;

said first interface assembly extending through said first exterior surface of said rigid housing including a linking member with a circumference sized to fittingly engage a PCMCIA card socket of a host computer;

said rigid housing permanently fixed to said computer about said circumference of said linking member;

said second interface assembly extending through a second exterior surface of said rigid housing, said second interface assembly including an element-resistant external component plug, said external component plug operatively connected with a PCMCIA card input/output plug of said first interface assembly, said external component plug forming a weather-tight connection for a linking cable.

2. The computer interconnect device of claim 1, wherein said rigid housing and said computer are integrally molded together about said circumference of said linking member.

3. The computer interconnect device of claim 1 wherein said rigid housing is water/dust impermeable.

4. The computer device interconnect of claim 2, wherein a score line is formed in said circumference of said linking member.

5. The computer device interconnect of claim 4, wherein a gasket member is operatively associated with said linking member, said gasket member providing a seal between said linking member and said PCMCIA card socket of said host computer.

6. The computer interconnect device of claim 1, whereby said circumference of said linking member is permanently fixed about the host computer PCMIA socket providing a mechanical connection between a rugged external component and said host computer.

* * * * *